(12) United States Patent
Yoo et al.

(10) Patent No.: US 10,641,805 B2
(45) Date of Patent: May 5, 2020

(54) CAPACITANCE DETECTION METHOD AND CAPACITANCE DETECTION APPARATUS USING THE SAME

(71) Applicant: MELFAS INC., Gyeonggi-do (KR)

(72) Inventors: Jae Woo Yoo, Gyeonggi-do (KR); Min Suk Woo, Seoul (KR); Se Woong Moon, Gyeonggi-do (KR)

(73) Assignee: MELFAS INC., Seongnam-si (KR)

( * ) Notice: Subject to any disclaimer, the term of this patent is extended or adjusted under 35 U.S.C. 154(b) by 101 days.

(21) Appl. No.: 15/903,217

(22) Filed: Feb. 23, 2018

(65) Prior Publication Data

US 2018/0238944 A1  Aug. 23, 2018

(30) Foreign Application Priority Data

Feb. 23, 2017  (KR) .................. 10-2017-0023972

(51) Int. Cl.
  *G01R 27/26*  (2006.01)
  *G01R 35/00*  (2006.01)
  (Continued)

(52) U.S. Cl.
  CPC ....... *G01R 27/2605* (2013.01); *G01R 35/005* (2013.01); *G06F 3/0418* (2013.01); *G06F 3/044* (2013.01)

(58) Field of Classification Search
  CPC ...... G06F 3/0418; G06F 3/044; G01R 35/005
  See application file for complete search history.

(56) References Cited

U.S. PATENT DOCUMENTS

2006/0284177 A1\* 12/2006 Hynecek ........... H01L 27/14603
  257/59
2013/0181934 A1\* 7/2013 Brunet ................. G06F 3/0416
  345/174
(Continued)

FOREIGN PATENT DOCUMENTS

CN  105487730 A  4/2016
CN  106201133 A  12/2016
(Continued)

OTHER PUBLICATIONS

Office Action for related Korean Application 10-2017-0023972, dated Sep. 5, 2017.

*Primary Examiner* — Jermele M Hollington
*Assistant Examiner* — Alvaro E Fortich
(74) *Attorney, Agent, or Firm* — Yakov Sidorin; Quarles & Brady LLP

(57) ABSTRACT

Disclosed is a capacitance detection apparatus including a panel, having a parasitic capacitor formed therein, and an electrode that forms, in operation of the apparatus a self-capacitor with an object; a compensation capacitor configured to share charges with the parasitic capacitor and the self-capacitor to output a detection signal with compensation for an influence of the parasitic capacitor; a switch unit including a plurality of switches which get turned on or off so that the compensation capacitor compensates for the influence of the parasitic capacitor, and an output voltage adjusting unit connected to the compensation capacitor and configured to adjust an output range of the detection signal output by the compensation capacitor.

15 Claims, 12 Drawing Sheets

(51) Int. Cl.
   *G06F 3/041*      (2006.01)
   *G06F 3/044*      (2006.01)

(56) References Cited

U.S. PATENT DOCUMENTS

| | | | |
|---|---|---|---|
| 2013/0307812 A1* | 11/2013 | Hanssen | G06F 3/044 |
| | | | 345/174 |
| 2014/0292705 A1 | 10/2014 | Tan et al. | |
| 2016/0065230 A1* | 3/2016 | Mulder | H03M 1/1014 |
| | | | 341/158 |
| 2016/0098117 A1* | 4/2016 | Ouh | G06F 3/044 |
| | | | 345/174 |
| 2016/0349906 A1* | 12/2016 | Lee | G06F 3/0416 |
| 2018/0088193 A1* | 3/2018 | Rearick | G01R 33/445 |

FOREIGN PATENT DOCUMENTS

| | | | |
|---|---|---|---|
| KR | 20110125347 A | | 11/2011 |
| KR | 101564069 | * | 10/2015 |
| KR | 101564069 B1 | | 10/2015 |
| KR | 101679986 B1 | | 12/2016 |

* cited by examiner

CAPACITANCE DETECTION METHOD AND CAPACITANCE DETECTION APPARATUS USING THE SAME

CROSS-REFERENCE TO RELATED APPLICATIONS

This application claims priority to and the benefit from the Korean Patent Application No. 10-2017-0023972, filed on Feb. 23, 2017, the disclosure of which is incorporated herein by reference in its entirety.

BACKGROUND

1. Field of the Invention

The present invention relates to a capacitance detection method and a capacitance detection apparatus using the same.

2. Discussion of Related Art

Currently, sensing methods used in touchscreens mainly consist of a resistive sensing method, a surface acoustic wave sensing method, and a capacitive sensing method. A capacitive sensing method tends to be adopted as a main input means of a portable mobile device because the method is capable of multi-touch detection and has excellent durability and visibility.

A capacitive touchscreen detects a change due to user interference of an electric charge charged in capacitive sensors on a touchscreen panel to recognize a user input. A capacitive touchscreen is classified into a self-capacitive touchscreen and a mutual-capacitive touchscreen according to a charge storage method. A self-capacitive touchscreen is configured so that one conductor may be formed for each capacitive sensor to form a reference ground and a charge surface outside a touch screen panel while a mutual-capacitive touchscreen is configured so that two conductors on a touch screen panel may form mutual charge surfaces to function as one capacitive sensor.

A typical self-capacitive touch screen uses an X/Y orthogonal arrangement of conductors. In this case, each capacitive sensor functions as a line sensor, and thus only one piece of X-sensing information and one piece of Y-sensing information are respectively provided from an X-line sensor group and a Y-line sensor group whenever input detection is performed in the touchscreen. Accordingly, a general self-capacitive touchscreen is capable of detecting and tracking a single touch but cannot support multiple touches. A mutual-capacitive touchscreen also uses an X/Y orthogonal arrangement of conductors. However, a mutual-capacitive touchscreen differs from a self-capacitive touchscreen in that each capacitive sensor is formed at a corresponding conductor-orthogonal position in the form of a grid sensor and that individual responses of grid sensors are independently sensed when a user input is detected on the touch screen. Since each grid sensor corresponds to a different X/Y coordinate and provides an independent reaction result, the mutual-capacitive touchscreen can extract user input information from an X/Y-sense information set provided from a group of X/Y grid sensors to sense and track multiple touches from the user.

SUMMARY OF THE INVENTION

It is possible to enhance detection sensitivity by increasing a voltage provided to a panel in order to reduce an influence of a parasitic capacitor formed in the panel. However, since a circuit interfaced with the panel is driven with a low voltage, it is not possible to secure operational reliability when a high voltage is provided. In order to operate reliably even when a high voltage is provided to the circuit interfaced with the panel, the circuit should have a high withstand voltage, but this is uneconomical.

The present embodiment is intended to solve the above problems and is directed to allow a high voltage to be provided to a panel in order to enhance capacitance detection sensitivity and also allow a circuit operating with a low voltage to be interfaced with the panel.

According to an aspect of the present invention, there is provided a capacitance detection apparatus including a panel having a parasitic capacitor formed therein and including an electrode which forms a self-capacitor with an object; a compensation capacitor configured to share electrical charges with the parasitic capacitor and the self-capacitor to output a detection signal with compensation for operational influence or impact or effect produced by the presence of parasitic capacitor; a switch unit including a plurality of switches which get turned on or off so that the compensation capacitor compensates for the influence or effect produced by the parasitic capacitor; and an output voltage adjusting unit connected to the compensation capacitor and configured to adjust an output range of the detection signal output by the compensation capacitor.

According to another aspect of the present invention, there is provided a capacitance detection method including pre-charging a parasitic capacitor and a self-capacitor formed in a panel with a first voltage and pre-charging a compensation capacitor with a second voltage; electrically connecting the self-capacitor, the parasitic capacitor, and the compensation capacitor to share electrical charges therebetween; providing an offset voltage to the compensation capacitor to adjust a range of a signal output by the compensation capacitor; and outputting the signal with the adjusted range.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION

Figure 1:
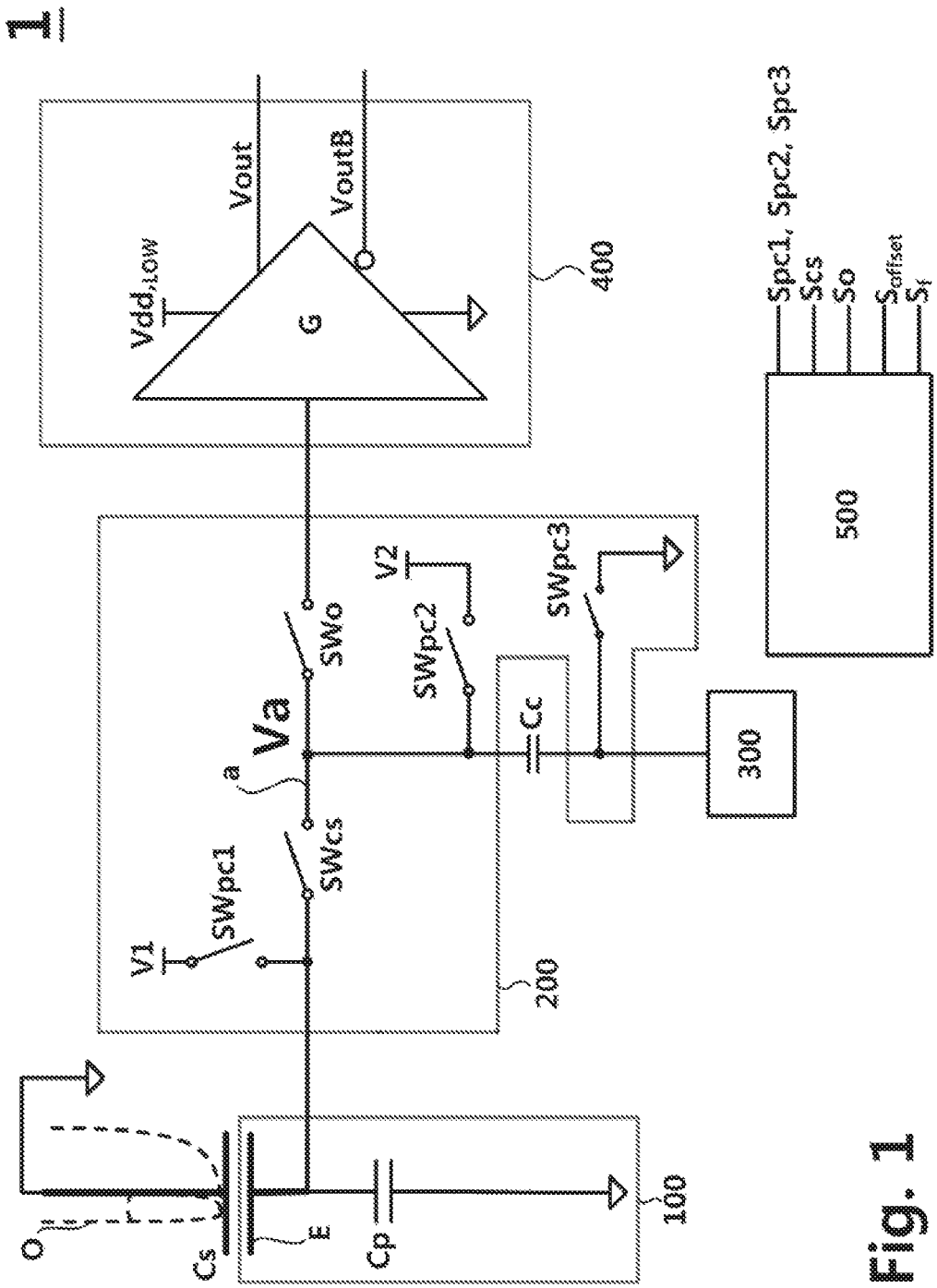
FIG. 1 is a schematic circuit diagram showing a touch detection apparatus according to the present embodiment.

The description of the present invention provides just examples for the purposes of structural and functional illustrations, and thus the scope of the present invention should not be construed as being limited by these examples. That is, since the present invention may be variously modified and have several related embodiments, the scope of the present invention should be understood as including equivalents by implementing which the goal of the present invention may be achieved.

Unless expressly stated otherwise, the terms used herein are defined and should be understood as follows.

The terms first, second, and the like are descriptive and may be only used to distinguish one element from another, and thus the scope of the present invention should not be limited by the terms. For example, a first element could be termed a second element, and similarly, a second element could be termed a first element.

It should be understood that, when one element is referred to as being "above" another chosen element, such element may be on the other chosen element directly or with still another element(s) intervening therebetween. On the other hand, it should be understood that when one element is referred to as being "on" another chosen element, there is no intervening element therebetween. Further, other expressions describing the relationships between elements should be interpreted in the same way (e.g., "intervening" versus "directly intervening," "between" versus "directly between," "adjacent" versus "directly adjacent," etc.).

Singular forms are intended to include plural forms unless the context clearly indicates otherwise. It should be further understood that the term "comprise," "include," or "have" as used herein specify the presence of stated features, numerals, steps, operations, elements, components, or a combination thereof, but do not preclude the presence or addition of one or more other features, numerals, steps, operations, elements, components, or combinations thereof.

The method steps may be performed in different orders unless the order is specifically stated. That is, the respective steps may be performed in the same order as described, substantially simultaneously, or in reverse or mixed order.

For convenience of the description, the drawings referred to in the present disclosure are not to scale, and may be deliberately exaggerated in size, height, thickness, and the like, but are not enlarged or reduced with any particular ratio or coefficient. Also, any elements shown in the drawings may be deliberately reduced, or other elements may be deliberately enlarged.

Unless otherwise defined, all terms used herein have the same meaning as commonly understood by one of ordinary skill in the art to which this invention belongs. Generally used terms, such as terms defined in dictionaries, should be construed as having meanings matching contextual meanings in the art. In this description, unless defined clearly, terms are not ideally or excessively construed as having formal meanings.

In this disclosure, an entity used by a user to apply an input to a chosen target is defined as an object. In particular, such an object refers to an entity (for example, a hand, a palm, or a stylus) capable of touching, being brought in contact, and/or hovering over a panel of an embodiment to provide a change in capacitance. However, the examples are intended to describe the object, and not limit such description to a range of objects. Thus, a cheek, a toe, or the like may also be used as the object.

Figure 2:
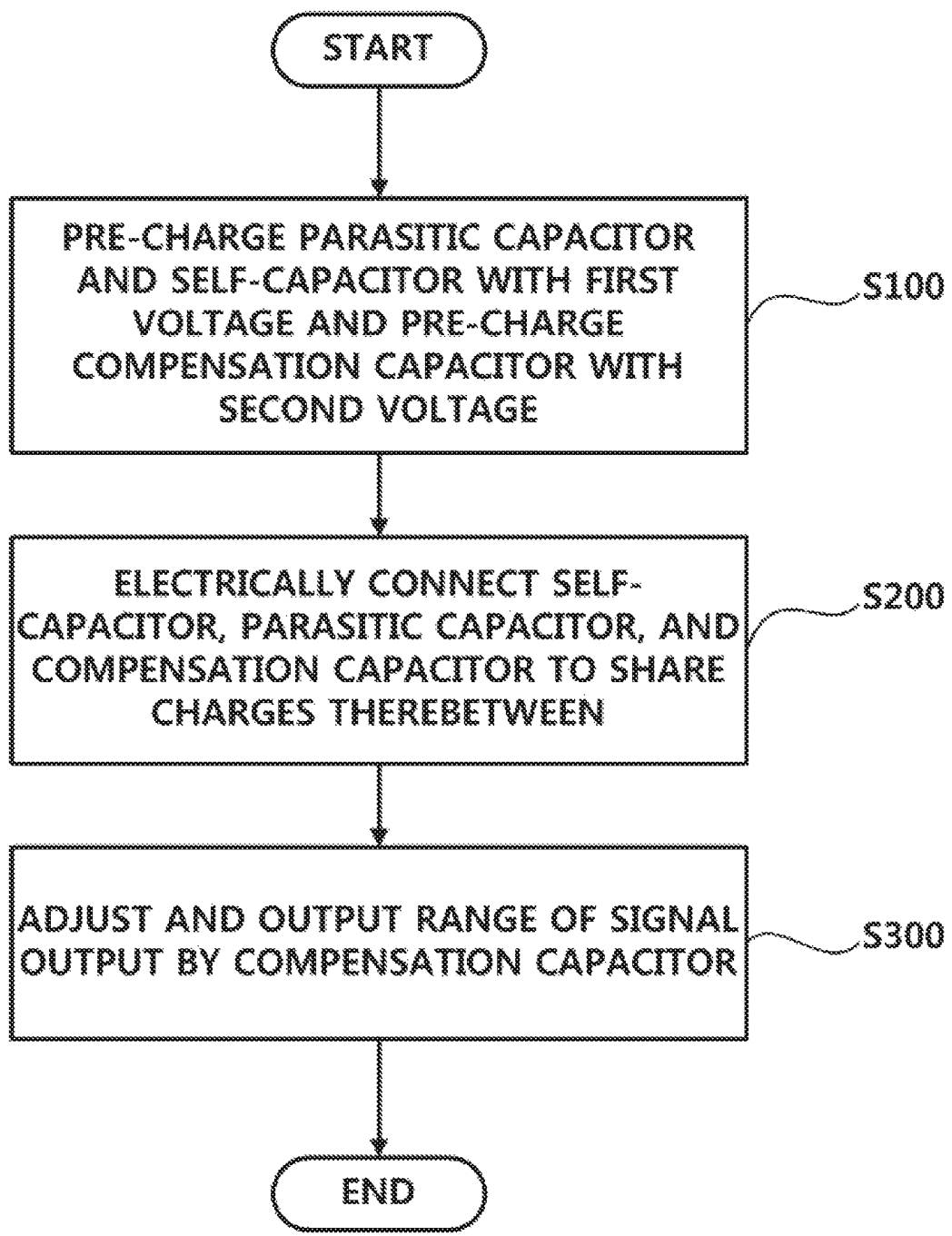
FIG. 2 is a schematic flowchart showing a touch detection method according to the present embodiment.

The present embodiment will be now described with reference to the accompanying drawings. FIG. 1 is a schematic circuit diagram showing a touch detection apparatus 1 configured according to an embodiment. FIG. 2 is a schematic flowchart showing a touch detection method according to the present embodiment. Referring to FIGS. 1 and 2, the touch detection apparatus 1 includes a panel 100 that includes a parasitic capacitor Cp formed therein and an electrode E. The electrode E is configured such that that an object O is used to provide an input applied to the panel 100, a capacitor Cs is formed between the electrode E and the object O. Such input-caused capacitor is referred to as a self-capacitor. The touch detection apparatus also includes a compensation capacitor Cc, which is configured to share charges with the parasitic capacitor Cp and the self-capacitor Cs to output a detection signal with compensation for an influence of the parasitic capacitor Cp; a switch unit 200 including a plurality of switches that get turned on or off to cause the compensation capacitor Cc to compensate for the influence of the parasitic capacitor Cp; and an output voltage adjusting unit 300 that is connected to the compensation capacitor Cc and that is configured to adjust an output range of the detection signal output by the compensation capacitor Cc.

A touch detection method (otherwise referred to as a method for touch detection) according to the present embodiment includes pre-charging a parasitic capacitor Cp and a self-capacitor Cs (formed in a panel 100 when the (outside) input is applied to the panel 100) with a first voltage and pre-charging a compensation capacitor Cc with a second voltage (at step S100). The method further includes electrically connecting the self-capacitor Cs, the parasitic capacitor, and the compensation capacitor Cc to share charges therebetween (at step S200), providing an offset voltage to the compensation capacitor Cc to adjust a range of a detection signal output by the compensation capacitor Cc (at step S300), and outputting or producing an adjusted detection signal output formed by performing the charge sharing step (at step S400).

As already discussed, the panel 100 includes at least one electrode E. In operation of the device 1, the electrode E functions as one electrode of the self-capacitor Cs, and the object O functions as the other electrode of the self-capacitor Cs.

An actual implementation of the panel 100 has several capacitances such as, for example, a parasitic capacitance formed between the ground voltage and electrodes, a parasitic capacitance formed between adjacent electrodes, and the like. Here, the term parasitic capacitance Cp refers to an equivalent parasitic capacitance including all parasitic capacitances formed with participation of the electrode E (which forms a self-capacitance Cs with the object O).

The electrode E of the panel 100 forms one electrode of the self-capacitor Cs, and the object O forms the other electrode of the self-capacitor Cs. The object O, when acting on the paten 100 to form an input to the panel, is electrically connected to the ground and the self-capacitor Cs is connected in parallel to the parasitic capacitor Cp. An equivalent capacitance, viewed or assessed from the switch unit 200, is a capacitance C=Cp+Cs formed by connecting the self capacitance Cs in parallel to the parasitic capacitance Cp.

$$C = \epsilon \frac{A}{d} \qquad \text{[Equation 1]}$$

where C is a capacitance, A is the area of an electrode, d is a distance between electrodes, and ε is permittivity.

Referring to Equation 1 (which is used to calculate a capacitance of a capacitor), it can be seen that the capacitance of the self-capacitor changes depending on a separation distance between the object O, and also that the electrode E and the panel 100 is touched with the object O to provide a touch input when the capacitance of the self-capacitor is greater than or equal to a certain value.

The switch unit 200 includes a first pre-charge switch SWpc1, which in operation of the device is turned on to pre-charge the self-capacitor Cs and the parasitic capacitor Cp; a second pre-charge switch SWpc2, which is turned on to pre-charge the compensation capacitor Cc; a charge sharing switch SWcs, which is turned on to share charges between the self-capacitor Cs, the parasitic capacitor Cp, and the compensation capacitor Cc; and an output switch SWo configured to provide a detection signal output by the compensation capacitor Cc. In an embodiment shown in FIG. 1, the switch unit 200 includes a third pre-charge switch SWpc3 configured to provide a pre-charge path for connecting the compensation capacitor Cc and the ground in the pre-charging (pc) step (see FIG. 5). In another embodiment, the output voltage adjusting unit 300 may provide the pre-charge path for connecting the ground to the compensation capacitor Cc.

A value of the first voltage V1 used to pre-charge the self-capacitor Cs and the parasitic capacitor Cp and a value of the second voltage V2 used to pre-charge the compensation capacitor Cc are controlled by a control unit 500. As an example, in a pre-charging step in a first phase P1 of operation (see FIG. 5), the control unit 500 provides a driving voltage Vdd as the first voltage V1 and provides a ground voltage Vgnd as the second voltage V2. In a pre-charging step in a second phase P2 of operation (see FIG. 5), the control unit 500 provides the ground voltage Vgnd as the first voltage V1 and provides the driving voltage Vdd as the second voltage V2.

Figure 3C:
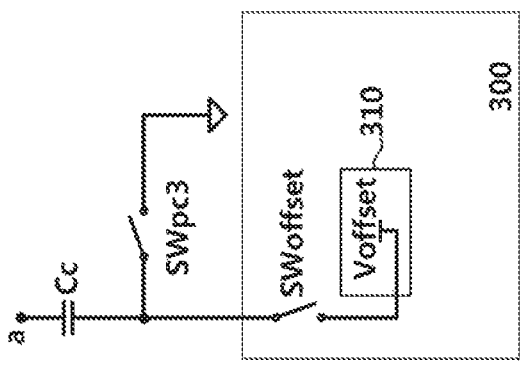
FIGS. 3(a), 3(b), and 3(c) are schematic views showing examples of an output voltage adjusting unit.
Figure 3B:
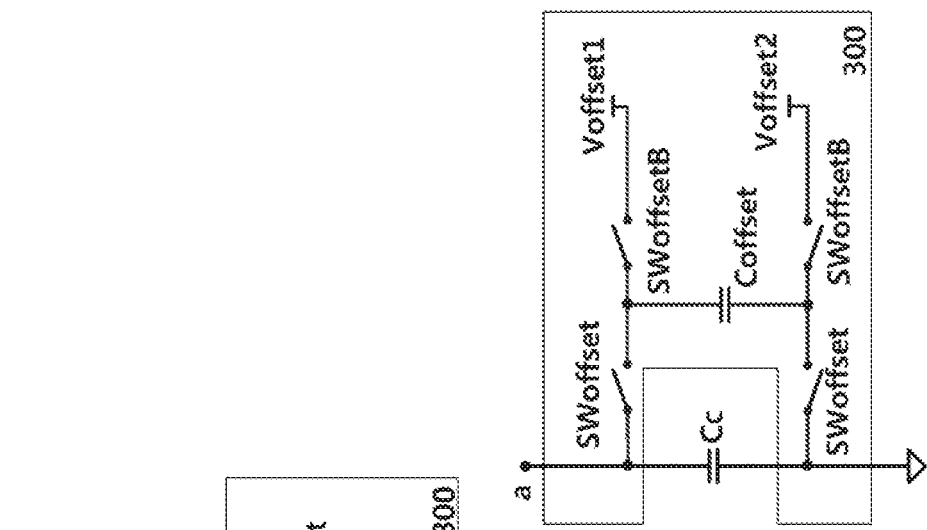
Figure 3A:
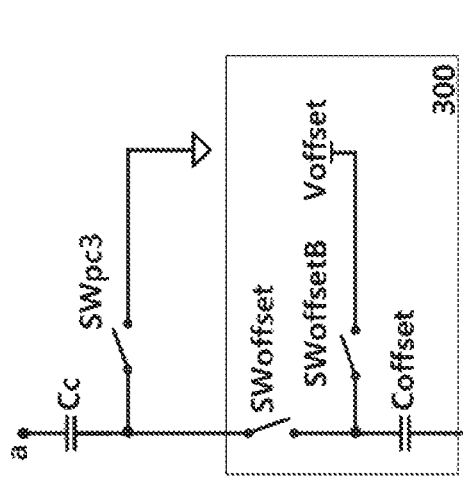

FIGS. 3(a), 3(b), 3(c) are schematic views showing examples of the configuration(s) of the output voltage adjusting unit 300. Referring to an example shown in FIG. 3(a), the output voltage adjusting unit 300 includes an offset capacitor Coffset configured to share charges with the compensation capacitor Cc and an offset switch SWoffset configured to electrically connect or disconnect the compensation capacitor Cc to or from the offset capacitor Coffset.

As an embodiment, the offset capacitor Coffset may be pre-charged with an offset voltage Voffset, and when the offset switch SWoffset is turned on and electrically connected to the compensation capacitor Cc, the compensation capacitor Cc and the offset capacitor Coffset may share charges with each other to increase or decrease a voltage of the detection signal output by the compensation capacitor Cc.

The offset capacitor Coffset may be pre-charged with the offset voltage Voffset by turning on an inverting offset switch SWoffsetB driven with a signal obtained by inverting an offset signal provided to the offset switch SWoffset. When the offset switch SWoffset is turned on, the offset capacitor Coffset may be connected in series to and configured to share charges with the compensation capacitor Cc to adjust a voltage Va (see FIG. 1) of a node a.

As an example, the offset voltage Voffset provided to the offset capacitor Coffset may be any voltage in the range between the ground voltage and the driving voltage Vdd. As another example, the offset voltage Voffset provided to the offset capacitor Coffset may be a negative voltage obtained by inverting any voltage in the range between the ground voltage and the driving voltage Vdd.

When the offset switch SWoffset is turned on, the compensation capacitor Cc and the offset capacitor Coffset may share charges with each other to adjust a voltage output by the compensation capacitor Cc.

Referring to an example shown in FIG. 3(b), the output voltage adjusting unit 300 includes an offset capacitor Coffset connected in parallel to and configured to share charges with the compensation capacitor Cc and an offset switch SWoffset configured to electrically connect or disconnect the compensation capacitor Cc to or from the offset capacitor Coffset. As an embodiment, the offset capacitor Coffset may be pre-charged with a voltage corresponding to a difference between offset voltages Voffset1 and Voffset2, and when the offset switch SWoffset is turned on and electrically connected to the compensation capacitor Cc, the compensation capacitor Cc and the offset capacitor Coffset may share charges with each other to increase or decrease a voltage output by the compensation capacitor Cc.

The inverting offset switch SWoffsetB driven with the signal obtained by inverting the offset signal provided to the offset switch SWoffset gets turned on to provide an offset voltage Voffset1 to one end of the offset capacitor Coffset and provide an offset voltage Voffset2 to the other end of the offset capacitor Coffset. In this case, the offset capacitor Coffset is pre-charged with a voltage in the range between the offset voltage Voffset1 and the offset voltage Voffset2. When the offset switch SWoffset is turned on, the offset capacitor Coffset may be connected in parallel to and configured to share charges with the compensation capacitor Cc to adjust the voltage of the node a.

As an example, the offset voltage charged in the offset capacitor Coffset may be any voltage between the range of the ground voltage Vgnd and the driving voltage Vdd. As another example, the offset voltage charged in the offset capacitor Coffset may be a negative voltage obtained by inverting any voltage in the range between the ground voltage Vgnd and the driving voltage Vdd.

When the offset switch SWoffset is turned on, the compensation capacitor Cc and the offset capacitor Coffset may share charges with each other to adjust the voltage of the detection signal output by the compensation capacitor Cc.

Referring to an example shown in FIG. 3(c), the output voltage adjusting unit 300 includes an offset voltage providing unit 310 configured to provide an offset voltage Voffset to one end of the compensation capacitor Cc and an offset switch SWoffset configured to connect or disconnect the offset voltage providing unit 310 to or from the compensation capacitor Cc.

As an example, when a voltage is charged in or discharged from the compensation capacitor Cc, the offset switch SWoffset gets closed to add an offset voltage to a voltage formed in the compensation capacitor Cc and output the voltage to which the offset voltage is added. The offset voltage Voffset provided by the offset voltage providing unit 310 may be a positive voltage for increasing the voltage output by the compensation capacitor Cc. As another example, the offset voltage provided by the offset voltage providing unit 310 may be a negative voltage for decreasing the voltage output by the compensation capacitor Cc.

Figure 4A:
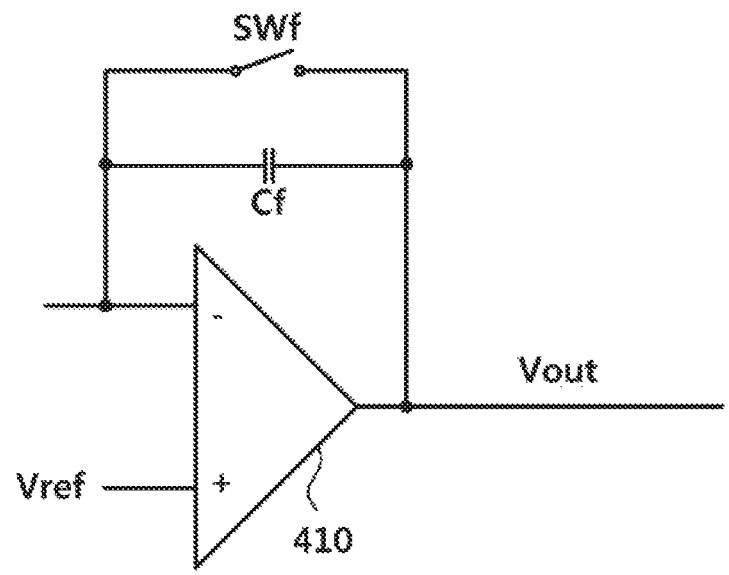
FIGS. 4(a), 4(b) are block diagrams illustrating an example of a signal conversion unit.
Figure 4B:
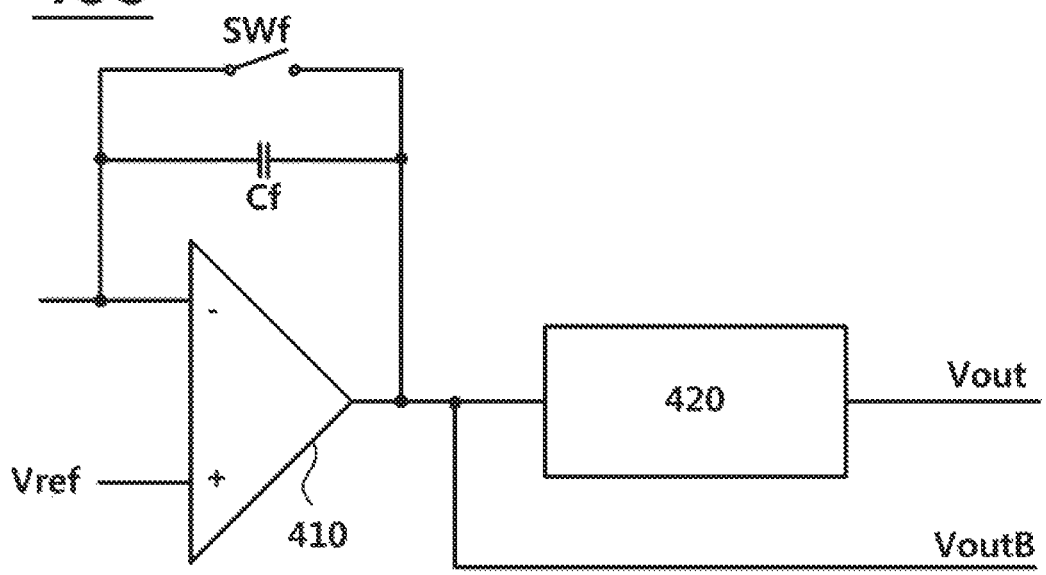

FIGS. 4(a), 4(b) provide block diagrams showing an example of a signal conversion unit 400. Referring to FIG. 4(a), the signal conversion unit 400 includes a charge amplifier 410, and the charge amplifier 410 receives a detection signal with compensation for an influence of the parasitic capacitor Cp, integrates the received detection signal, and then outputs the integrated detection signal Vout. The charge amplifier includes a feedback capacitor Cf connected to an output node and an inverting input node and includes a flush switch SWf configured to flush charges charged in the feedback capacitor Cf.

In an example shown in FIG. 4(b), the signal conversion unit 400 converts a detection signal provided by the compensation capacitor Cc into a pseudo differential signal and outputs the pseudo differential signal. The signal conversion unit 400 includes a charge amplifier 410 configured to integrate and output the detection signal provided by the compensation capacitor Cc and includes a delay unit 420 configured to delay and output an output signal of the charge amplifier 410.

The compensation capacitor Cc provides a detection signal to the charge amplifier 410, and the charge amplifier 410 accumulates the provided detection signal and then outputs the accumulated detection signal. Until the charge amplifier 410 outputs a signal VoutB, the delay unit 420 maintains and outputs the signal provided by the charge amplifier 410. The signal Vout maintained and output by the switch unit 200 in the first phase P1 (see FIG. 5) is complementary to the signal VoutB output by the switch unit 200 in the second phase P2 (see FIG. 5). However, the charge sharing process performed in the first phase to form the signal Vout and the charge sharing process performed in the second phase to form the signal VoutB are performed at different times, and thus the signals Vout and VoutB are pseudo differential signals.

In an embodiment, the signal conversion unit 400 may further include an amplifier (not shown), and the touch detection apparatus 1 according to the present embodiment may further include an analog-to-digital converter (ADC) (not shown) configured to receive a pair of output signals Vout and VoutB of the signal conversion unit 400 and convert the output signal pair into a digital signal.

The control unit 500 controls the switches included in the switch unit 200, the output voltage adjusting unit 300, and the signal conversion unit 400. In an embodiment, the first, second, and third pre-charge switches SWpc1, SWpc2, and SWpc3 included in the switch unit 200, the charge sharing switch SWcs, the output switch SWo, and the flush switch SWf included in the signal conversion unit 400 are controlled and get turned on or off by control signals Spc1, Spc2, Spc3, Scs, So, Soffset, and Sf provided by the control unit 500.

The control unit 500 controls voltages provided as the first voltage V1 and the second voltage V2. As an example, the control unit 500 may provide the driving voltage Vdd as the first voltage V1 and also provide the ground voltage Vgnd as the second voltage V2. As another example, the control unit 500 may provide the ground voltage Vgnd as the first voltage V1 and also provide the driving voltage Vdd as the second voltage V2.

Figure 5:
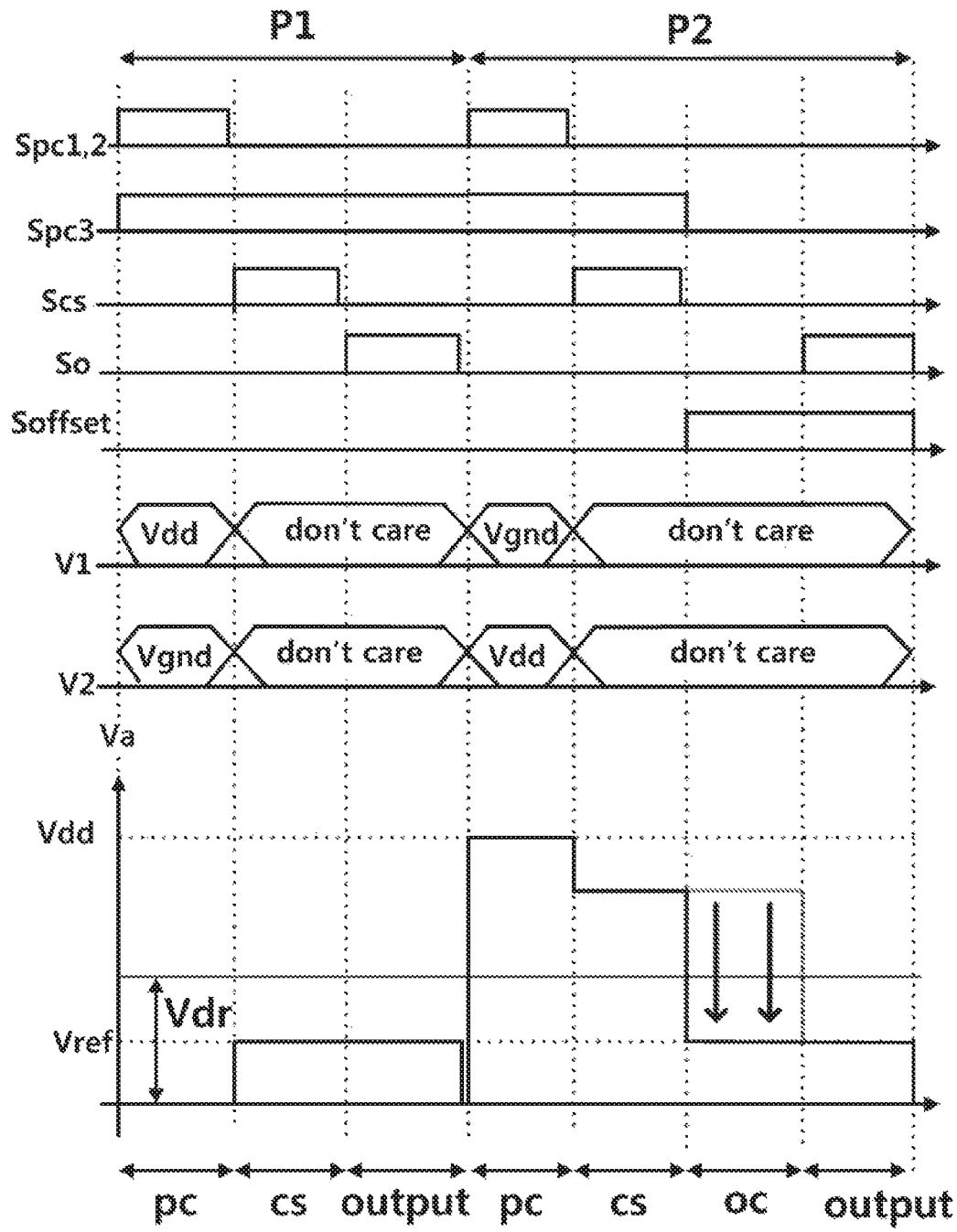
FIG. 5 is a timing diagram of a capacitance detection apparatus according to the present embodiment.

Here, operation of a capacitance detection apparatus according to the present embodiment will be described with reference to FIGS. 5, 6, 7, 8, 9, 10, 11, and 12. FIG. 5 is a timing diagram of the capacitance detection apparatus according to the present embodiment, and FIGS. 6 through 12 are views showing equivalent circuits depending on phases of the capacitance detection apparatus according to the present embodiment.

An example in which a capacitance detection apparatus 1 outputs a capacitance detection result by using a pseudo differential signal will be described below. This is not intended to limit the present invention, and is merely intended to describe embodiments. The capacitance detection apparatus 1 may, for instance, output the capacitance detection result by using a single-ended signal.

Referring to FIG. 5, a capacitance detection process according to an embodiment includes the first phase P1 and the second phase P2. The first phase P1 includes a pre-charging (pc) step, a chare sharing step (cs), and an output step, and the second phase P2 includes a pre-charging (pc) step, a charge sharing (cs) step, an output voltage adjusting (oc) step, and an output step. According to another embodiment not shown herein, the first phase and the second phase may all include the pre-charging (pc) step, the charge sharing (cs) step, the output voltage adjusting (oc) step, and the output step. According to still another embodiment not show herein, the first phase and the second phase may all include the pre-charging (pc) step, the charge sharing (cs) step, and the output step.

In an embodiment illustrated in FIG. 5, it is shown that the second phase P2 is performed immediately after the moment when the first phase P1 ends. However, in practice, the second phase P2 may be performed with a predetermined time-delay after the first phase P1 ends. Also, the second phase P2 is described as being performed after the first phase P1. However, in a related implementation the first phase P1 may be performed after the second phase P2.

Figure 6:
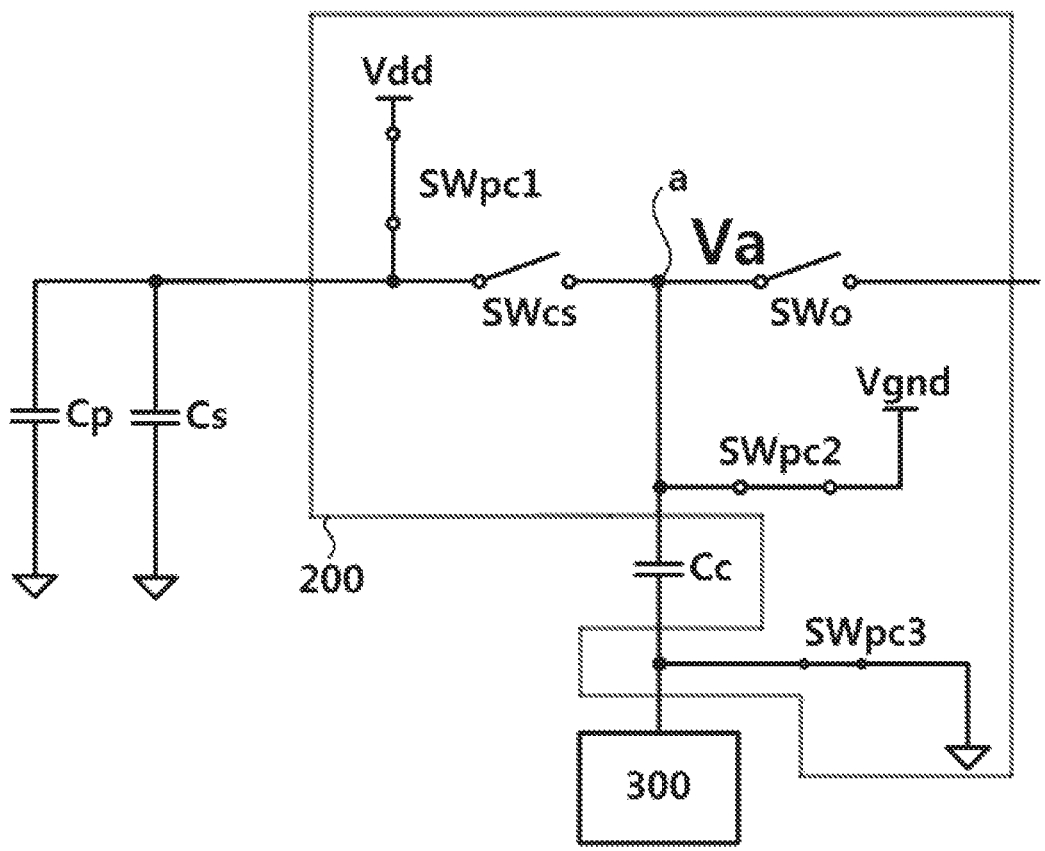
FIGS. 6, 7, 8, 9, 10, 11, and 12 show equivalent circuits of the capacitance detection apparatus according to the present embodiment, in different phases.
Figure 6:
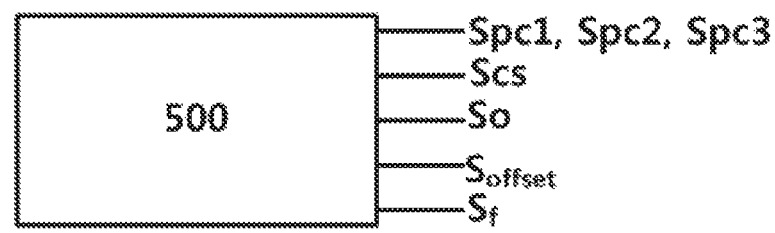

FIG. 6 illustrates an equivalent circuit corresponding to a first phase (P1) pre-charging (pc) step and the control unit 500. Referring to FIGS. 5 and 6, in the first phase (P1) pre-charging (pc) step, the control unit 500 operates to provide (i) a driving voltage Vdd as the first voltage V1, provides (ii) a ground voltage as the second voltage V2, and provides (iii) pre-charge signals Spc1 and Spc2 and a pre-charge signal Spc3, so that the self-capacitor Cs formed by the object O and the electrode E and the parasitic capacitor Cp may be pre-charged with the driving voltage Vdd and the compensation capacitor Cc may be pre-charged with the ground voltage Vgnd.

In an embodiment illustrated in FIG. 6, in the pre-charging (pc) step, the pre-charge switch SWpc3 may get closed to form an electrical pre-charge path of the compensation capacitor Cc. In an embodiment not shown here for the simplicity of illustration, the control unit 500 may be configured to control an offset voltage and an offset switch included in the output voltage adjusting unit 300 to form the pre-charge path of the compensation capacitor Cc. In the pre-charging (pc) step, a voltage Va at an output node a of the compensation capacitor Cc is equal to the ground voltage Vgnd.

Figure 7:
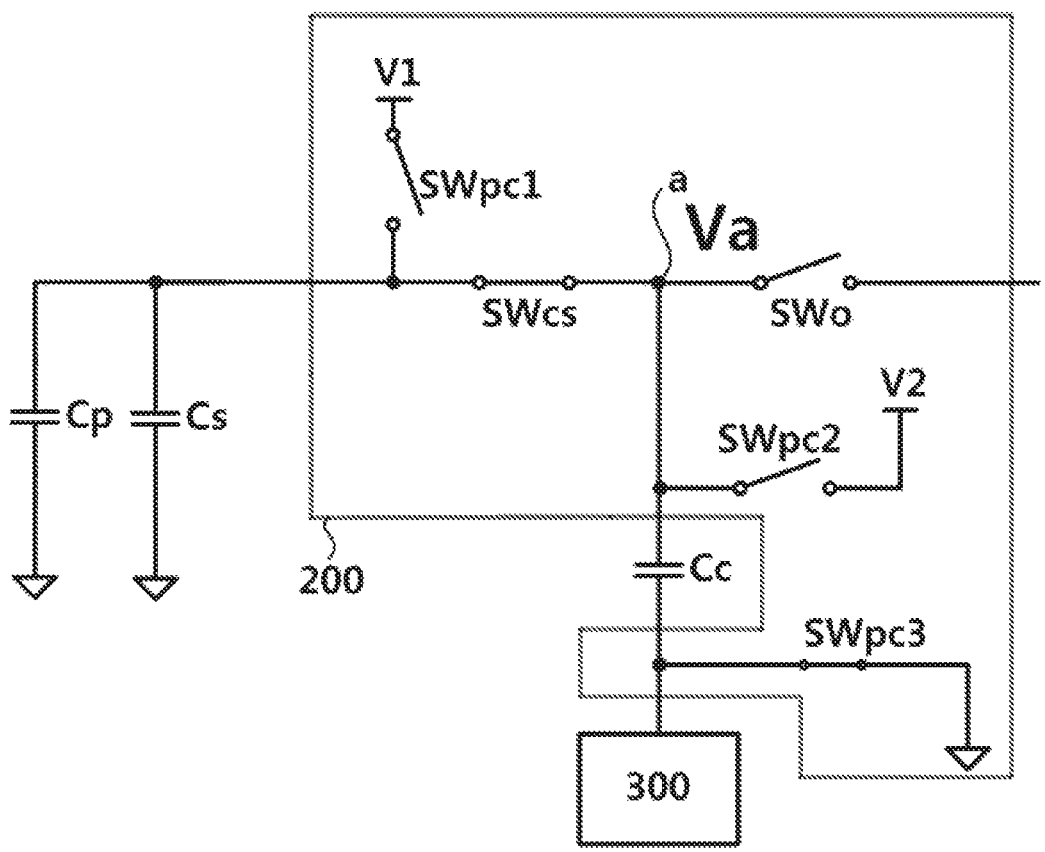
Figure 7:
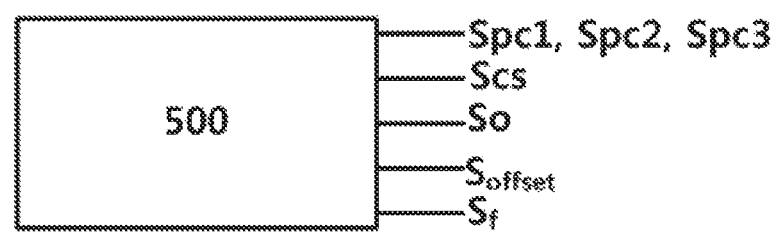

FIG. 7 illustrates an equivalent circuit corresponding to a first phase (P1) charge sharing (cs) step and the control unit 500. Referring to FIGS. 5 and 7, in the first phase charge sharing (cs) step, the control unit 500 operates to provide (i) a charge sharing signal Scs so that the parasitic capacitor Cp, the self-capacitor Cs, and the compensation capacitor Cc may share charges with each other. Since the pre-charge switches SWpc1 and SWpc2 are opened, the voltages provided as the first voltage V1 and the second voltage V2 have no association with each other.

In an embodiment of the charge sharing (cs) step shown in FIG. 7, the pre-charge switch SWpc3 gets turned on to provide a path through which the parasitic capacitor Cp, the self-capacitor Cs, and the compensation capacitor Cc share charges with each other. In an embodiment not shown herein, the control unit 500 may control an offset voltage and an offset switch included in the output voltage adjusting unit 300 to form the charge sharing path.

The parasitic capacitor Cp, the self-capacitor Cs, and the compensation capacitor Cc connected in parallel may have the same voltage due to the charge sharing. The voltage Va of the output node a formed by performing charge sharing in the first phase is greater than the ground voltage Vgnd and smaller than the driving voltage Vdd. Va may be expressed as Equation 2 below:

$$V_a = \frac{(Cs + Cp)}{Cs + Cp + Cc} Vdd. \quad \text{[Equation 2]}$$

Figure 8:
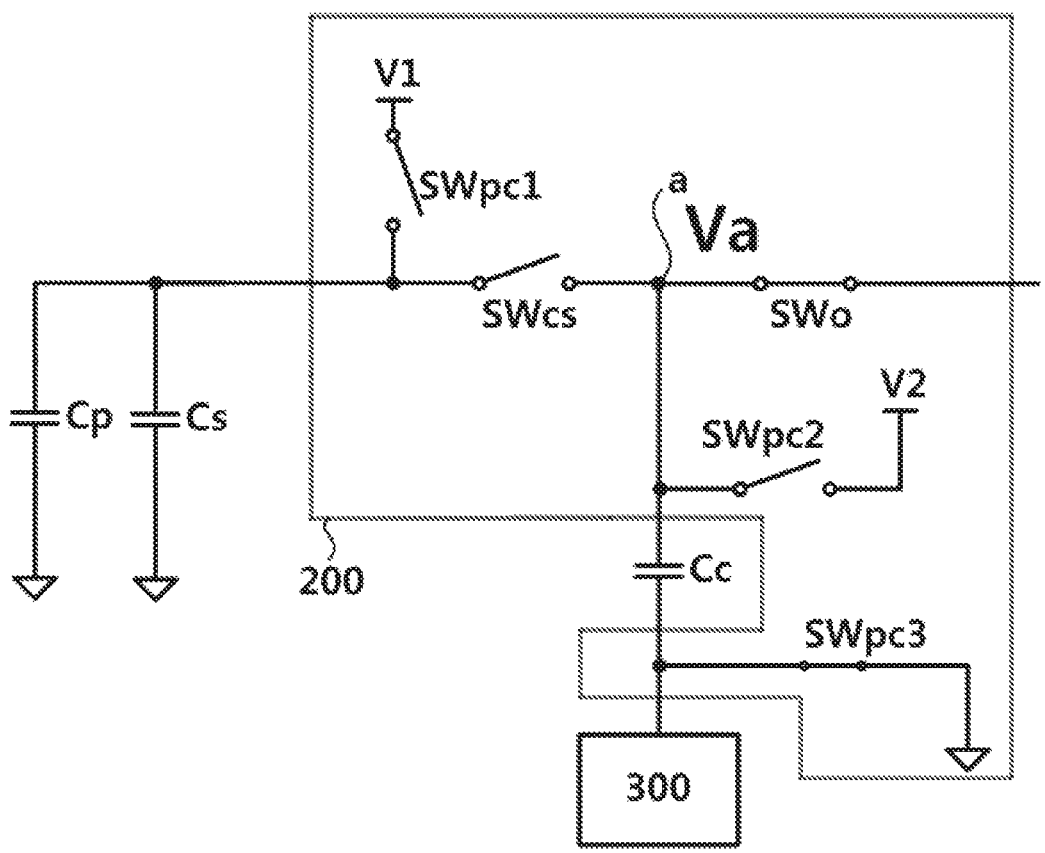
Figure 8:
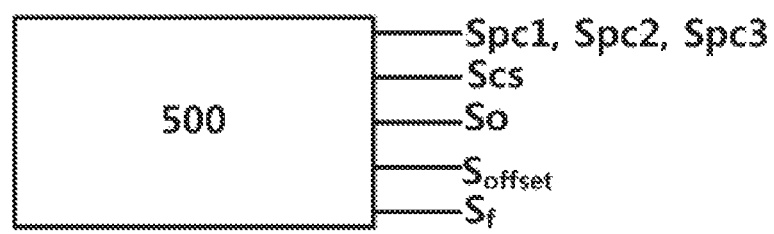

FIG. 8 illustrates an equivalent circuit corresponding to a first phase (P1) output step and the control unit 500. Referring to FIGS. 5 and 8, the compensation capacitor Cc provides the output voltage Va to the charge amplifier 410 through the output switch SWo. The output voltage provided by the compensation capacitor Cc is the same as described in Equation 2.

In the first phase P1 output step, the control unit 500 opens the charge sharing switch SWcs and executes control so that the parasitic capacitor Cp, the self-capacitor Cs, and the compensation capacitor Cc are not electrically connected to each other, and provides a signal so that the output switch SWo gets turned on. Since the pre-charge switches SWpc1 and SWpc2 are opened, the voltages provided as the first voltage V1 and the second voltage V2 have no association with each other.

Similarly to the embodiment illustrated in FIG. 8, in the output step, the pre-charge switch SWpc3 may get turned on to provide the ground voltage to one end of the compensation capacitor Cc. In an embodiment not shown here for the simplicity of illustrations, the control unit 500 may be configured to control the offset voltage and the offset switch included in the output voltage adjusting unit 300 to provide the ground voltage to one end of the compensation capacitor Cc.

By opening the charge sharing switch SWcs, it is possible to block noise from flowing into a detection circuit unit through the panel 100, thus enhancing a signal-to-noise ratio of an output signal Va.

When the ratio of the capacitance Cc of the compensation capacitor to the sum of the capacitance Cs of the self-capacitor and the capacitance Cp of the parasitic capacitor is a certain value N, the voltage Va of the output node a at the first phase may be approximated as shown in Equation 3 below:

$$V_a = \frac{(Cs+Cp)}{Cs+Cp+Cc} Vdd = \frac{\frac{(Cs+Cp)}{(Cs+Cp)}}{\frac{Cs+Cp}{(Cs+Cp)} + \frac{Cc}{(Cs+Cp)}} Vdd = \frac{1}{1+N} Vdd. \quad \text{[Equation 3]}$$

That is, when the capacitance of the compensation capacitor is greater than two times the sum of the capacitance of the self-capacitor and the capacitance of the parasitic capacitor, the voltage Va1 of the output node a at the first phase is calculated as ⅓ of the driving voltage Vdd.

Figure 9:
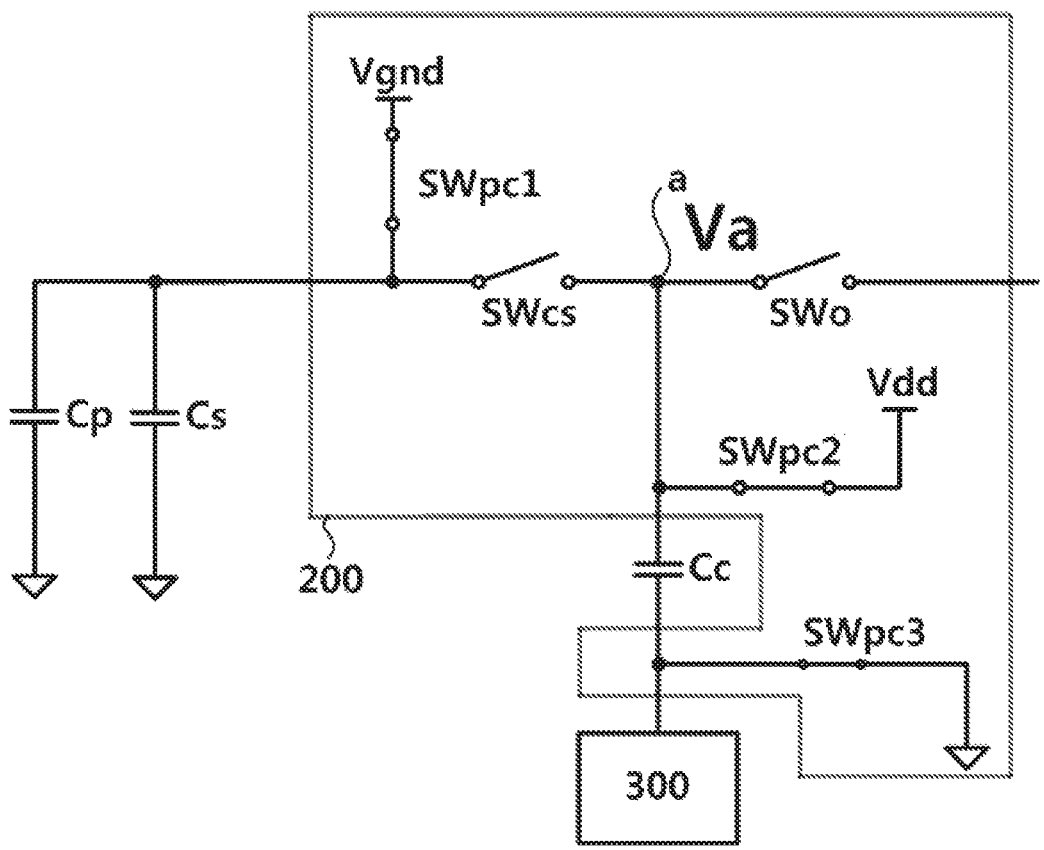
Figure 9:
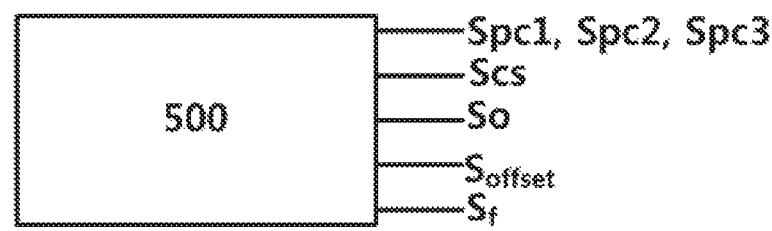

FIG. 9 is a schematic illustration of an equivalent circuit corresponding to a second phase (P2) pre-charging (pc) step and the control unit 500. Referring to FIGS. 5 and 9, in the second phase (P2) pre-charging (pc) step, the control unit 500 operates to provide a ground voltage Vgnd as the first voltage V1, provides a driving voltage Vdd as the second voltage V2, and provides pre-charge signals Spc1, Spc2, and Spc3, so that the self-capacitor Cs and the parasitic capacitor Cp are pre-charged with the ground voltage Vgnd and the compensation capacitor Cc is pre-charged with the driving voltage Vdd.

In a related embodiment not shown here for simplicity of illustration, the control unit 500 may be configured to control an offset voltage and an offset switch included in the output voltage adjusting unit 300 to form the pre-charge path of the compensation capacitor Cc. In the pre-charging (pc) step, the voltage Va at the output node a is equal to the driving voltage Vdd.

Figure 10:
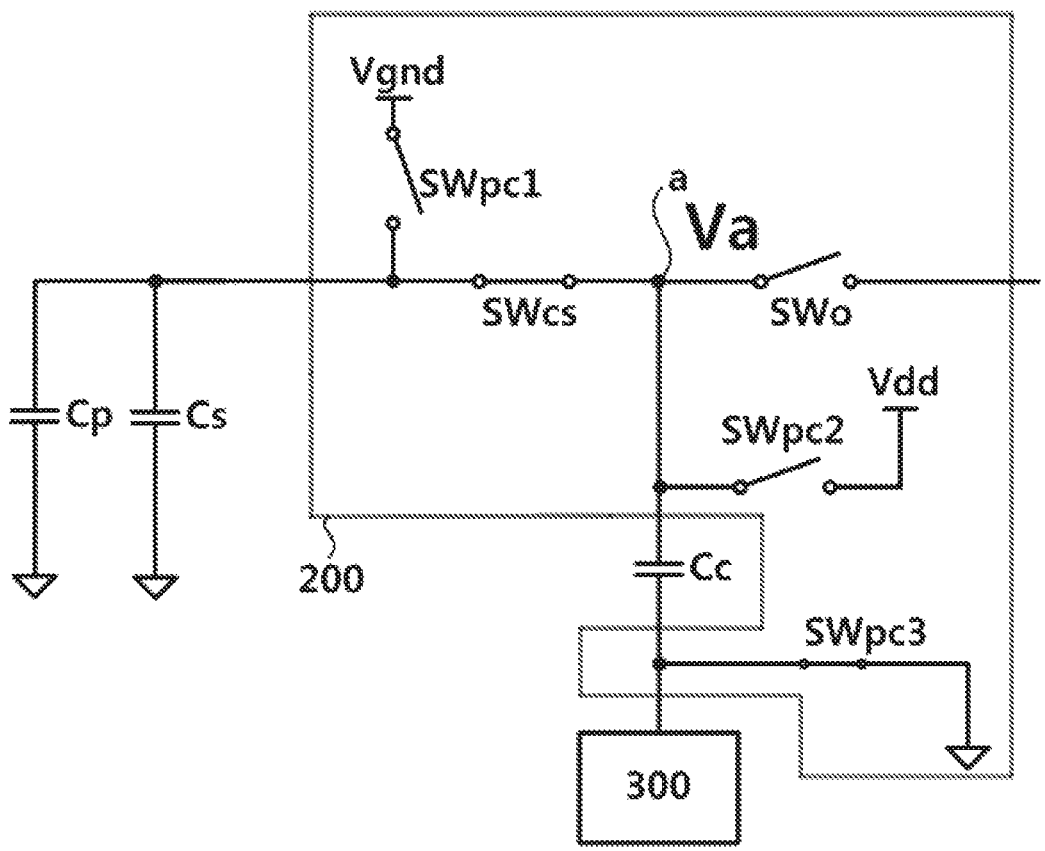
Figure 10:
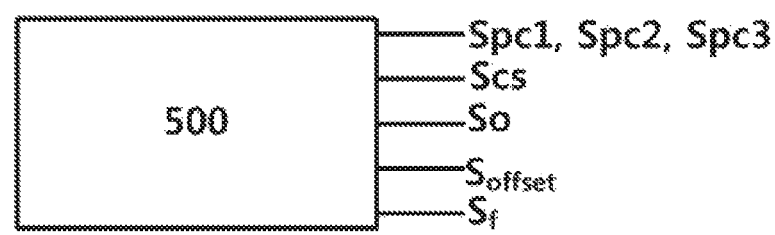

FIG. 10 is an equivalent circuit shown to correspond to a second phase (P2) charge sharing (cs) step, and the control unit 500. Referring to FIGS. 5 and 10, in the first phase charge sharing (cs) step, the control unit 500 provides a charge sharing signal Scs to turn on the charge sharing switch SWcs so that the parasitic capacitor Cp, the self-capacitor Cs, and the compensation capacitor Cc may share charges with each other. Since the pre-charge switches SWpc1 and SWpc2 are opened, the voltages provided as the first voltage V1 and the second voltage V2 have no association with each other, and the pre-charge switch SWpc3 may get turned on.

The parasitic capacitor Cp, the self-capacitor Cs, and the compensation capacitor Cc connected in parallel may have the same voltage due to the charge sharing. The voltage Va of the output node a formed by performing charge sharing is greater than the ground voltage Vgnd and smaller than the driving voltage Vdd. The output voltage Va may be expressed as Equation 4 below:

$$V_a = \frac{Cc}{Cs+Cp+Cc} Vdd. \quad \text{[Equation 4]}$$

Figure 11:
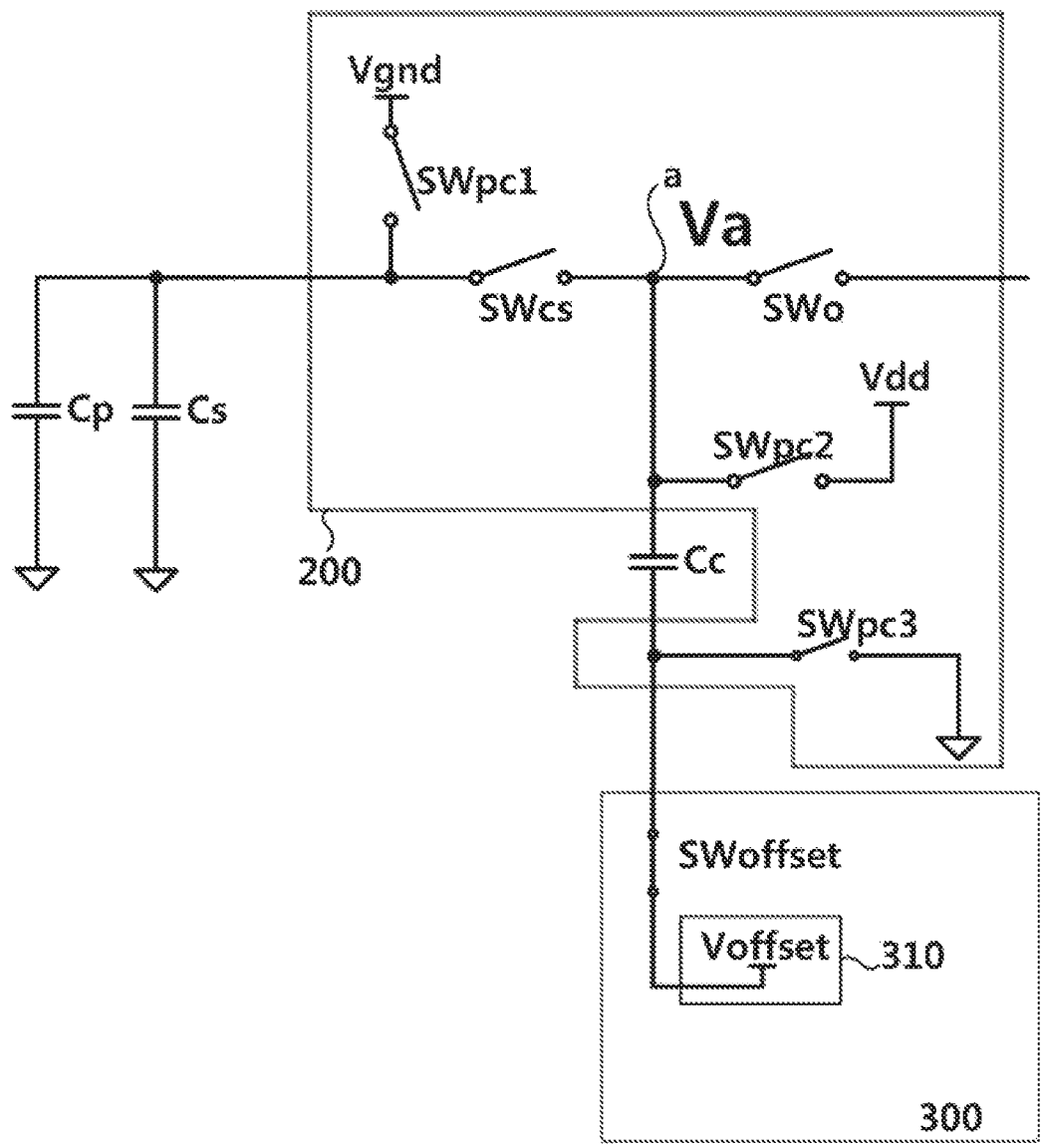
Figure 11:
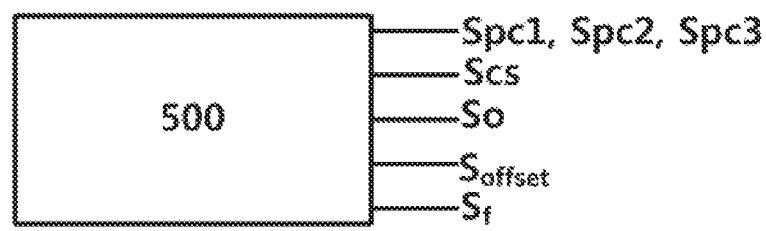

FIG. 11 provides a schematic equivalent circuit representing a second phase (P2) output voltage adjusting (oc) step and the control unit 500. Referring to FIGS. 11 and 5, in the second phase (P2) output voltage adjusting (oc) step, the control unit 500 controls the output voltage adjusting unit 300 to adjust the range of a signal output by the compensation capacitor Cc. As illustrated in FIG. 5, the voltage obtained by performing the second phase (P2) charge sharing (cs) step may not match an input dynamic range Vdr of the signal conversion unit 400. However, the output voltage may be converted into a target voltage level by performing the output voltage adjusting (oc) step.

Referring to an embodiment illustrated in FIG. 11, the control unit 500 operates by turning on the offset switch SWoffset so that the offset voltage providing unit 310 may provide an offset voltage Voffset to the other end of the compensation capacitor Cc. As an example, when the offset voltage providing unit 310 provides a negative voltage to one end of the compensation capacitor Cc, the output signal may be adjusted by decreasing the voltage of the output signal Va output by the compensation capacitor Cc. In an embodiment, the output voltage may be adjusted by adjusting the offset voltage Voffset.

In the embodiments shown in FIGS. 3(a) and 3(b), the control unit 500 is configured to turn on the offset switch SWoffset so that the offset capacitor Coffset and the compensation capacitor Cc may share charges with each other. When the compensation capacitor Cc and the offset capacitor Coffset share charges with each other, the amount of charge charged in the compensation capacitor Cc may change, and thus the voltage Va output by the compensation capacitor Cc may change. Accordingly, it becomes possible to adjust the range of the output voltage Va. In an embodiment, the range of the output voltage may be adjusted by adjusting the offset voltage Voffset and/or the capacitance Coffset of the offset capacitor according to the dynamic range Vdr.

In order to enhance capacitance detection sensitivity of the self-capacitor Cs, the voltage value of the driving voltage Vdd pre-charged in the parasitic capacitor Cp, the self-capacitor Cs, or the compensation capacitor Cc, formed in the panel 100, is several times higher than a voltage Vdd,$_{LOW}$ provided to the signal conversion unit 400 as the driving voltage. The signal conversion unit 400 may be formed as an integrated circuit in which a plurality of active devices and a plurality of passive devices are integrated with high density. The signal conversion unit 400 is driven with the voltage Vdd,$_{LOW}$, which is lower than the driving voltage Vdd, in order to obtain low power consumption and high integration, and thus the signal conversion unit 400 has an input dynamic range narrower than a distance between the ground voltage Vgnd and the driving voltage Vdd.

As illustrated in FIG. 5, the voltage Va of the output node a obtained in the second phase (P2) charge sharing (cs) step exceeds the input dynamic range Vdr of the signal conversion unit 400. Accordingly, when the output signal Va is directly provided to the signal conversion unit 400, the signal conversion unit 400 should be formed as a device having a high withstand voltage so that the signal conversion unit 400 is not destroyed by the driving voltage Vdd, which is a high voltage forming the signal conversion unit 400. However, it is uneconomical in terms of die size to form the signal conversion unit 400 as a device with a high withstand voltage.

However, when the output voltage adjusting (oc) process according to the present embodiment is performed, it is possible to adjust the range of the output signal Va output by the compensation capacitor Cc. Thus, there is no need to form the signal conversion unit 400 by means of a large high-withstand-voltage device. Furthermore, the driving voltage Vdd may be increased. Thus, it is possible to enhance the capacitance detection sensitivity and the signal-to-noise ratio (SNR) because the driving voltage Vdd may be increased, and also it is economical in terms of die size because there is no need to form a large high-withstand-voltage device.

Figure 12:
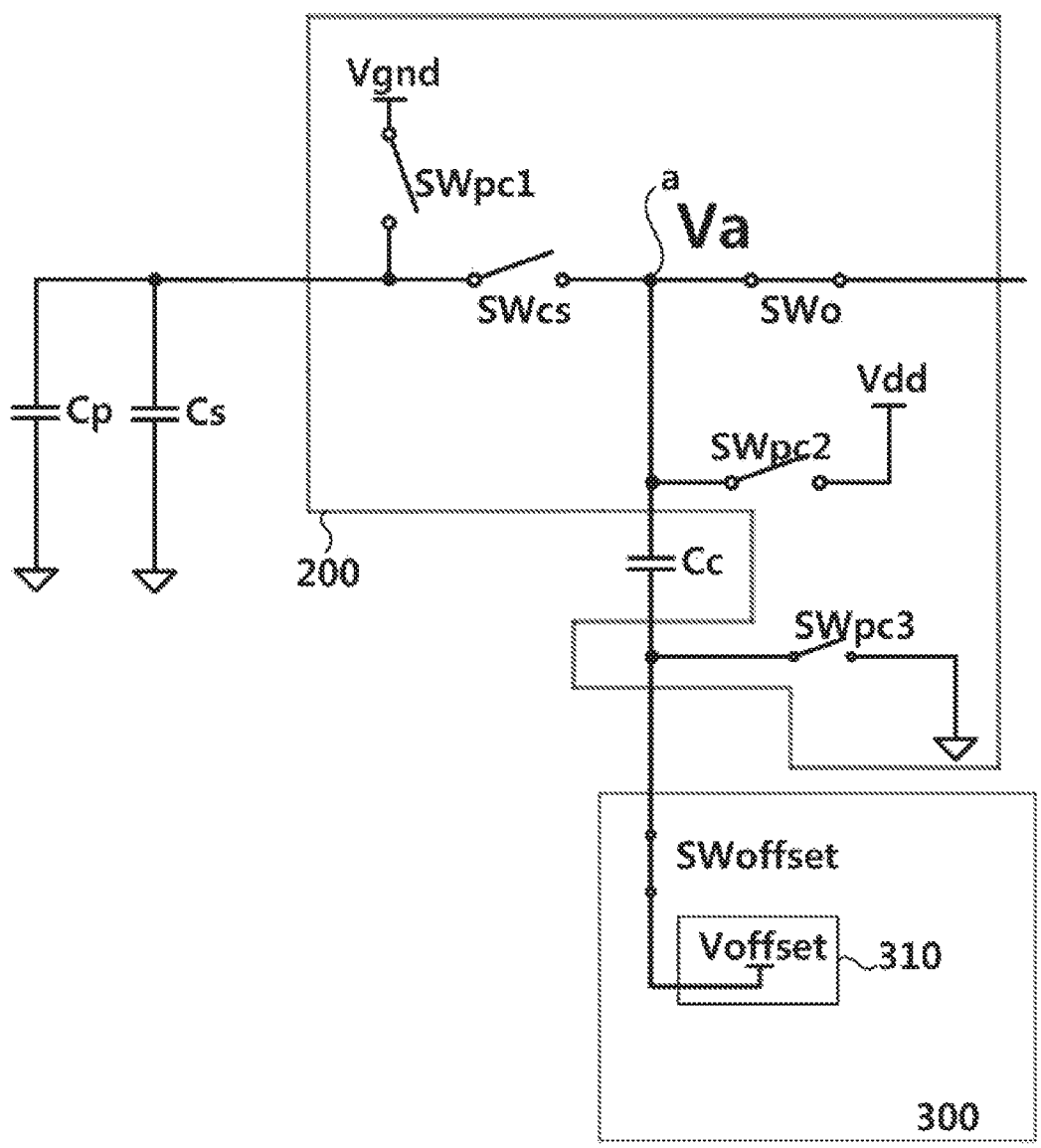
Figure 12:
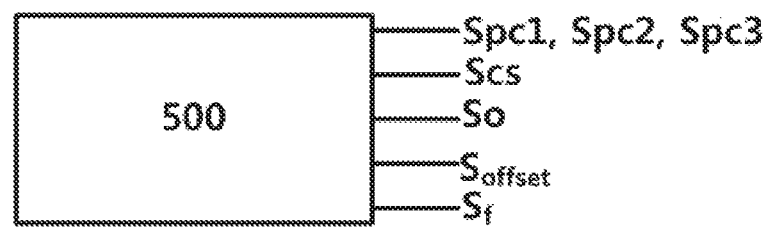

FIG. 12 presents an equivalent circuit corresponding to a second phase (P2) output step, and the control unit 500. Referring to FIGS. 5 and 12, the compensation capacitor Cc provides the output voltage Va to the charge amplifier 410 through the output switch SWo. As shown in FIG. 5, the output signal Va provided by the compensation capacitor Cc in the output step is within the input dynamic range Vdr of the charge amplifier 410. The charge amplifier 410 receives the output signal Va provided by the compensation capacitor Cc, accumulates the received output signal, and then outputs the accumulated signal.

Just like in the first phase output step, the charge sharing switch SWcs gets turned off, and thus it becomes possible to block noise from flowing into an internal circuit through a panel, as described above.

In an embodiment shown in FIG. 5, the output voltage adjusting (oc) step and the output step may be sequentially performed. As an embodiment, when the offset capacitor Coffset (see FIGS. 3(a) and 3(b)) and the compensation capacitor Cc share changes with each other to adjust the output voltage, the output voltage adjusting (oc) step and the output step may be sequentially performed.

In another embodiment, the output voltage adjusting (oc) step and the output step may be simultaneously performed. As an embodiment, in the output voltage adjusting (oc) step illustrated in FIG. 11, when an offset voltage is provided to the offset voltage providing unit 310 to adjust the output voltage, the output voltage adjusting (oc) step and the output step may be simultaneously performed.

In Equation 4 expressed above, when the ratio of the capacitance Cc of the compensation capacitor to the sum of the parasitic capacitance Cp and the capacitance Cs of the self-capacitor is a certain value N, Equation 4 may be expressed as Equation 5 below:

$$V_a = \frac{\frac{Cc}{Cc}}{\frac{Cs+Cp}{Cc} + \frac{Cc}{Cc}} Vdd = \frac{1}{\frac{1}{N}+1} Vdd = \frac{N}{1+N} Vdd. \quad [\text{Equation 5}]$$

When N=2, the voltage of the output node is ⅔ of the driving voltage.

In Equation 3, when the ratio of the capacitance Cc of the compensation capacitor to the sum of the parasitic capacitance Cp of the parasitic capacitor and the capacitance Cs of the self-capacitor is N, and for example, N=2, it can be seen that the voltage Va of the output node is ⅓ of the driving voltage. Furthermore, it can be seen in Equation 5 that the voltage Va of the output node is ⅔ of the driving voltage when N=2. That is, in Equation 3 and Equation 5, it can be seen that the voltage output by the compensation capacitor when the first phase P1 is performed is complementary to the voltage output by the compensation capacitor when the second phase P2 is performed.

In an embodiment, the charge amplifier 410 receives a signal output by the compensation capacitor Cc in the first phase (P1) output step, amplifies the output signal, and provides the amplified signal to the delay unit 420. Also, the charge amplifier 410 receives a signal output by the compensation capacitor Cc in the second phase (P2) output step, amplifies the output signal, and outputs the amplified signal as VoutB. The delay unit 420 samples and holds the provided signal, and then output a Vout signal when the charge amplifier provides the signal VoutB.

Vout and VoutB, which are signals amplified by the same amplifier, are complementary to each other. However, the signals are a pair of signals formed at different times and thus have a pseudo differential signal relationship.

According to the present embodiment, it is possible to enhance capacitance detection sensitivity by providing a high driving voltage to a panel, and it is also possible to enhance a signal-to-noise ratio by using a circuit operated with a low voltage. Further, since a pair of pseudo differential signals is formed by two charge sharing phases, it is possible to decrease a degree to which noise is introduced, and it is also possible to decrease the amount of noise introduced by decreasing an interval between the charge sharing phases.

According to the present embodiment, it is possible to enhance detection sensitivity by driving the capacitance detection apparatus with a high voltage and also possible to use a circuit driven with a low voltage by adjusting a range of a detection signal output by a compensation capacitor.

Accordingly, the embodiment and the accompany drawings of the present invention are to be considered descriptive and not restrictive of the invention, and do not limit the technical scope of the invention. The scope of the invention should be to be construed by the appended claims, and all technical ideas within the scope of their equivalents should be construed as being included in the scope of the invention.

What is claimed is:

1. A capacitance detection apparatus comprising:
a panel having a parasitic capacitor formed therein and including an electrode configured to form a self-capacitor with an object used to apply an input to the panel in operation of the apparatus;
a compensation capacitor configured to share charges with the parasitic capacitor and the self-capacitor to form a detection signal output with compensation for operational influence produce by the parasitic capacitor;
a switch unit including a plurality of switches configured to be turned on or off to compensate for said operational influence with the use of the compensation capacitor;
an output voltage adjusting electronic circuit connected to the compensation capacitor and configured to adjust an output range of the detection signal output by the compensation capacitor;
a signal conversion circuit configured to receive the detection signal output and convert a received detection signal output into a voltage signal, and
a control voltage source connected to the signal conversion circuit;
wherein the signal conversion circuit is configured to receive a first driving voltage from the control voltage source, the signal conversion circuit having a input dynamic range according to the first driving voltage, and the panel is configured to receive a second driving voltage greater than the first driving voltage from the control voltage source; and
wherein the output voltage adjusting electronic circuit is configured to adjust the output range of the detection signal to conform to the input dynamic range.

2. The capacitance detection apparatus of claim 1, wherein the switch unit is configured to be turned on or off by the control voltage source to pre-charge the parasitic capacitor and the self-capacitor of the panel and the compensation capacitor with different voltages, and wherein the pre-charged parasitic capacitor, self-capacitor, and compensation capacitor are operably configured to share charges with each other.

3. The capacitance detection apparatus of claim 2, wherein the switching unit comprises:
a first pre-charge switch configured to be turned on by the control voltage source to pre-charge the self-capacitor and the parasitic capacitor with a first voltage;
a second pre-charge switch configured to be turned on by the control voltage source to pre-charge the compensation capacitor with a second voltage; and
a charge sharing switch configured to be turned on by the control voltage source to effectuate sharing of charges between the self-capacitor, the parasitic capacitor, and the compensation capacitor.

4. The capacitance detection apparatus of claim 1, wherein the switch unit is configured to electrically disconnect the panel from the compensation capacitor when the compensation capacitor forms the detection signal output.

5. The capacitance detection apparatus of claim 1, wherein the output voltage adjusting electronic circuit comprises: an offset voltage source configured to provide an offset voltage to one electrode of the compensation capacitor; and an output voltage adjusting switch connected between an electrode of the compensation capacitor and the offset voltage source.

6. The capacitance detection apparatus of claim 1, wherein the output voltage adjusting electronic circuit comprises:
an offset capacitor configured to share charges with the compensation capacitor to adjust the output range of the detection signal; and
an output voltage adjusting switch connected between an electrode of the compensation capacitor and the offset capacitor.

7. The capacitance detection apparatus of claim 1, wherein said control voltage source is configured to control the switch unit in operation of the apparatus.

8. The capacitance detection apparatus of claim 1, further comprising signal conversion circuitry configured to receive the detection signal output and convert a received detection signal output into a pseudo-differential signal.

9. A capacitance detection method comprising:
pre-charging a parasitic capacitor and a self-capacitor, formed in a panel of a capacitance detection apparatus as a result of external input applied to an electrode of the panel having a first voltage and pre-charging a compensation capacitor of said apparatus with a second voltage;
electrically connecting the self-capacitor, the parasitic capacitor, and the compensation capacitor to share charges therebetween;
providing an offset voltage to the compensation capacitor to adjust a range of a detection signal output produced by the compensation capacitor to form an adjusted detection signal output;
providing the signal conversion circuitry with a first driving voltage to define an input dynamic range of the signal conversion circuitry;
providing the panel with a second driving voltage greater than the first driving voltage;
converting the adjusted detection signal into a voltage signal having an output dynamic range that conforms to the input dynamic range using the signal conversion circuitry; and
producing the adjusted detection signal output with the adjusted range.

10. The capacitance detection method of claim 9, wherein the producing of the adjusted detection signal output includes electrically disconnecting the panel from the compensation capacitor when the compensation capacitor produces the detection signal output.

11. The capacitance detection method of claim 9, wherein the producing of the adjusted detection signal includes connecting an offset capacitor of the apparatus to one end of the compensation capacitor to adjust a range of the detection signal output and produce the adjusted detection signal output with the adjusted range.

12. The capacitance detection method of claim 9, wherein the producing of the detection signal includes connecting an offset voltage source to one end of the compensation capacitor to adjust the range of the detection signal output and produce the adjusted detection signal with the adjusted range.

13. The capacitance detection method of claim 9, further comprising:
pre-charging the parasitic capacitor and the self-capacitor with the second voltage and pre-charging the compensation capacitor with the first voltage;
electrically connecting the self-capacitor, the parasitic capacitor, and the compensation capacitor thereby achieving sharing charges therebetween; and
outputting an inverting detection signal formed as a result of said achieving sharing charges.

14. The capacitance detection method of claim 13, further comprising forming a pseudo differential detection signal from the detection signal output and the inverting detection signal.

15. The capacitance detection method of claim 9, wherein (i) the providing the offset voltage to the compensation capacitor to adjust the range of the detection signal output and (ii) the producing the adjusted detection signal output are performed simultaneously.

* * * * *